(12) United States Patent
Kim

(10) Patent No.: US 8,114,694 B2
(45) Date of Patent: Feb. 14, 2012

(54) METHOD FOR MANUFACTURING BACK SIDE ILLUMINATON IMAGE SENSOR

(75) Inventor: Mun Hwan Kim, Chungbuk (KR)

(73) Assignee: Dongbu Hitek Co., Ltd., Seoul (KR)

( * ) Notice: Subject to any disclaimer, the term of this patent is extended or adjusted under 35 U.S.C. 154(b) by 201 days.

(21) Appl. No.: 12/640,874

(22) Filed: Dec. 17, 2009

(65) Prior Publication Data

US 2010/0167447 A1 Jul. 1, 2010

(30) Foreign Application Priority Data

Dec. 26, 2008 (KR) .................. 10-2008-0134588

(51) Int. Cl.
*H01L 21/00* (2006.01)
(52) U.S. Cl. ........ 438/48; 438/69; 438/75; 257/E21.617
(58) Field of Classification Search .................... 438/48, 438/65, 69, 75, 128, 144; 257/E21.617, E21.053
See application file for complete search history.

(56) References Cited

U.S. PATENT DOCUMENTS 7,883,916 B2 * 2/2011 Gambino et al. ............... 438/48

* cited by examiner

*Primary Examiner* — Hoai V Pham
(74) *Attorney, Agent, or Firm* — Saliwanchik, Lloyd & Eisenschenk

(57) ABSTRACT

A method of manufacturing a back side illumination image sensor according to an embodiment includes: forming an ion implantation layer by implanting ions throughout the front side of a first substrate; defining a pixel region by forming a device isolation region on the front side of the first substrate; forming a photosensitive device and a readout circuit on the pixel region; forming an interlayer dielectric layer and a metal line on the front side of the first substrate; bonding a second substrate with the front side of the first substrate where the metal line is formed; removing a lower part of the first substrate under the ion implantation layer; applying wet etching to a back side of the first substrate after removing the lower part; and forming a microlens on the photosensitive device at the back side of the first substrate.

19 Claims, 6 Drawing Sheets

METHOD FOR MANUFACTURING BACK SIDE ILLUMINATON IMAGE SENSOR

CROSS-REFERENCE TO RELATED APPLICATION

This application claims the benefit under 35 U.S.C. §119 of Korean Patent Application No. 10-2008-0134588, filed Dec. 26, 2008, which is hereby incorporated by reference in its entirety.

BACKGROUND

The present disclosure relates to a back side illumination image sensor.

Image sensors are semiconductor devices that convert optical images into electric signals and are generally classified as a CCD (Charge Coupled Device) image sensor or a CMOS image sensor (CIS).

A photodiode of a related art CIS is formed on a substrate by an ion implantation process. As the size of the photodiode gradually decreases to increase the number of pixels without increasing the chip size, there is growing tendency that image quality is reduced due to reduction of the area of the illumination part.

Further, since the stack height is not reduced as much as the reduction of the area of the illumination part, there is tendency that the number of photons entering the illumination part is reduced by diffraction of light, which is called "airy disk".

In order to address the above problem, there is provided a back side illumination image sensor that receives light through a wafer back side, minimizing the step at the upper portion of the illumination part and removing interference of light due to metal routing.

FIG. 1 is a cross-sectional view illustrating a process of a back side illumination image sensor according to the related art.

In the back side illumination image sensor according to the related art, an illumination device and a wiring are formed on the front side of a substrate, and then a back grinding for removing the rear side of the substrate to a predetermined thickness is performed. This back grinding process of the rear side of the substrate is for fitting the gap between an external module and an optical lens to an appropriate thickness.

However, in the back side illumination sensor according to the related art, an SOI (Silicon On Insulator) wafer is used as a donor wafer where an illumination device and a circuit part are formed, and then the SOI wafer is bonded to a handle wafer. Thereafter, a back side thinning process is applied to the donor wafer.

The backside thinning process that is applied to the donor wafer according to the relate art is as follows.

First, the backside grinding process is applied to the donor wafer such that several tens of μm remains on the upper portion of a BOX (Buried Oxide) layer of the SOI wafer. Thereafter, the backside thinning process is completed by performing an etch-back process.

However, according to the related art, since an expensive SOI wafer is used for the donor wafer, the cost for manufacturing process increases.

Further, according to the related art, as shown in FIG. 1, wafer edge thinning is generated by the backside grinding process of the donor wafer. Accordingly, a fail may occur in the chip at the wafer edge in the etch-back process performed after the backside grinding process, resulting in a problem that economical efficiency is considerably deteriorated.

Further, according to the related art, the wafer center is also exposed to plasma damage in the etch-back process of several tens of μm, resulting in a problem that sensor performance may be deteriorated.

Further, according to the related art, it is required to remove the portion of the substrate covering and corresponding to a photodiode on the back side of a silicon substrate.

However, a large number of defects are generated on the surface of the substrate by removing the back side of the silicon substrate. Therefore, characteristics relating to leakage are deteriorated, which deteriorates CIS image quality.

Meanwhile, according to another related art, the photodiode may be deposited by using amorphous silicon. Otherwise, a readout circuit is formed on a silicon substrate, the photodiode is formed on another wafer, and then the photodiode is formed over the readout circuit by wafer-to-wafer bonding to form an image sensor (hereinafter referred to as "3D image sensor"). The photodiode and the readout circuit are connected by a metal line.

However, according to the 3D-image sensor of the related art, when bonding the wafer having the readout circuit to the wafer having the photodiode, it can be difficult to completely electrically connect the readout circuit with the photodiode due to a problem relating to bonding. For example, according to the related art, a metal line is formed on the readout circuit and wafer-to-wafer bonding is performed such that the metal line contacts with the photodiode, but the metal line may not completely contact with the photodiode. Therefore, it can be difficult to implement an ohmic contact between the metal line and the photodiode. Further, according to the related art, a short may be generated in the metal line that is electrically connected with the photodiode. Accordingly, researches for preventing the short have been conducted, but the process becomes complicated.

BRIEF SUMMARY

Embodiments provide a method of manufacturing a back side illumination image sensor that makes it possible to stably and efficiently remove the rear side of the substrate in the back side illumination image sensor.

Further, embodiments provide a method of manufacturing a back side illumination image sensor that can improve image quality by effectively removing defects on the surface of a substrate which are generated in manufacturing the image sensor.

Further, embodiments provide a method of manufacturing a back side illumination image sensor that makes it possible to considerably reduce the manufacturing cost.

Further, embodiments provide a method of manufacturing a back side illumination image sensor that makes it possible to maximize the amount of incident light by minimizing the stack on an illumination part while disposing a photosensitive device and a readout circuit on the same substrate, and makes it possible to inhibit interference and reflection of light due to metal routing.

A method of manufacturing a back side illumination image sensor according to an embodiment includes: forming an ion implantation layer by implanting ions into an entire front side of a first substrate; defining a pixel region by forming a device isolation region on the front side of the first substrate; fanning a photosensitive device and a readout circuit on the pixel region; forming an interlayer dielectric layer and a metal line on the front side of the first substrate; bonding a second substrate with the front side of the first substrate formed with the metal line; removing a lower part of the first substrate under the ion implantation layer; performing wet etching to a back side of the first substrate; and forming a microlens on the photosensitive device at the back side of the first substrate.

Further, a method of manufacturing a back side illumination image sensor according to an embodiment includes: defining a pixel region by forming a device isolation region on a front side of a first substrate; forming an ion implantation layer by implanting ions into the entire front side of the first substrate formed with the device isolation region; forming a photosensitive device and a readout circuit on the pixel region; forming an interlayer dielectric layer and a metal line on the front side of the first substrate; bonding a second substrate with the front side of the first substrate formed with the metal line; removing a lower part of the first substrate under the ion implantation layer; performing wet etching to a back side of the first substrate; and forming a microlens on the photosensitive device at the back side of the first substrate.

A method of manufacturing a back side illumination image sensor according to an embodiment includes: forming an ion implantation layer by implanting ions into an entire front side of a first substrate; forming a photosensitive device and a readout circuit on the front side of the first substrate; forming an interlayer dielectric layer and a metal line on the front side of the first substrate; bonding a second substrate with the front side of the first substrate formed with the metal line; removing a lower part of the first substrate under the ion implantation layer; performing wet etching to a back side of the first substrate; and forming a microlens on the photosensitive device at the back side of the first substrate.

Further, a method of manufacturing a back side illumination image sensor according to an embodiment includes: forming a photosensitive device on a front side of a first substrate; forming an ion implantation layer in the front side of the first substrate formed with the photosensitive device; forming a readout circuit on the front side of the first substrate; forming an interlayer dielectric layer and a metal line on the front side of the first substrate; bonding a second substrate with the front side of the first substrate formed with the metal line; removing a lower part of the first substrate under the ion implantation layer; and performing wet etching to the back side of the first substrate.

DETAILED DESCRIPTION

Hereinafter, embodiments of a back side illumination image sensor and a method of manufacturing the back side illumination image sensor will be described with reference to the accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, or one or more intervening layers may also be present. In addition, it will also be understood that when a layer is referred to as being 'between' two layers, it can be the only layer between the two layers, or one or more intervening layers may also be present.

Hereinafter, a method of manufacturing a back side illumination image sensor according to an embodiment of the present invention will be described with reference to FIGS. 2 to 7.

Figure 1:
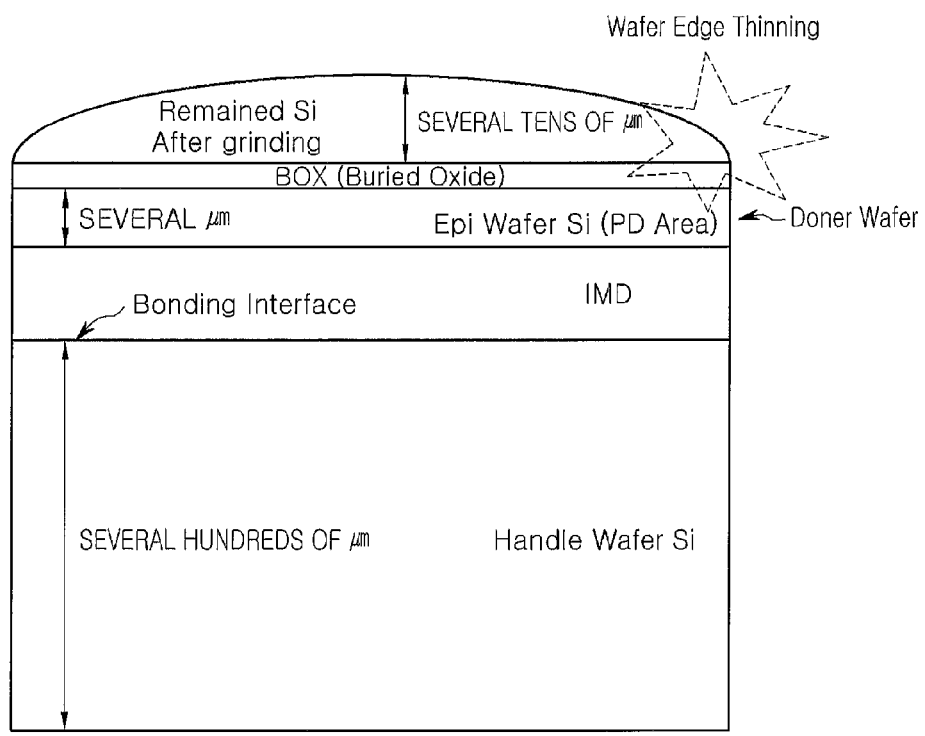
FIG. 1 is a cross-sectional diagram illustrating a back side illumination image sensor according to the related art.
Figure 2A:
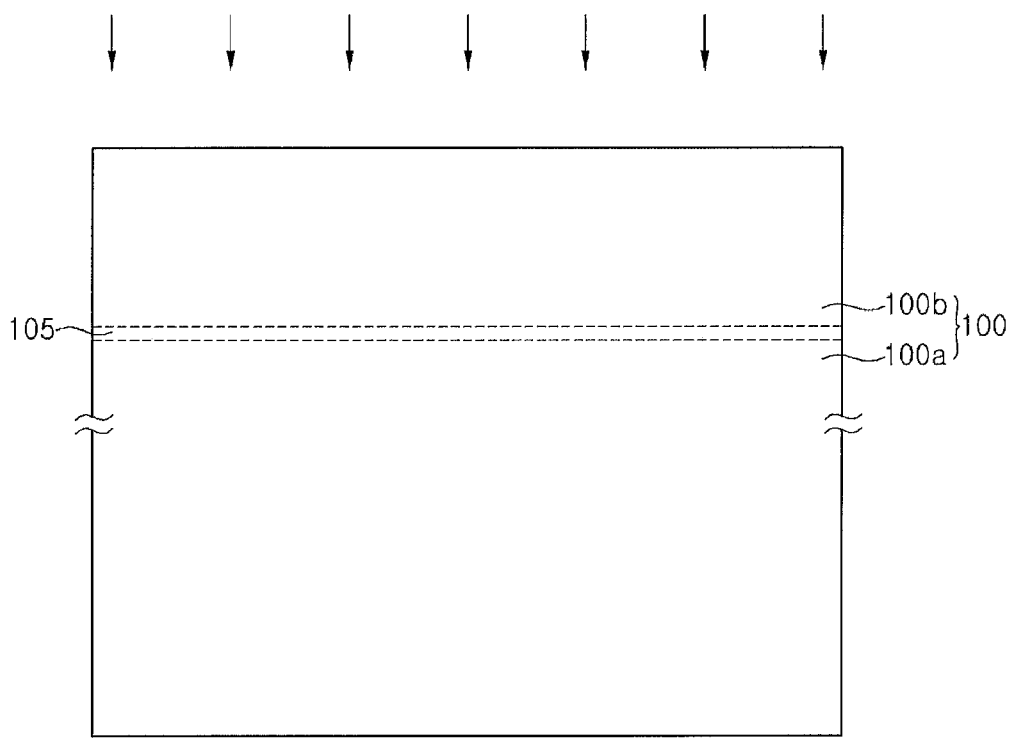
FIGS. 2 to 7 are cross-sectional diagrams illustrating a method of manufacturing a back side illumination image sensor according to an embodiment.
Figure 2B:
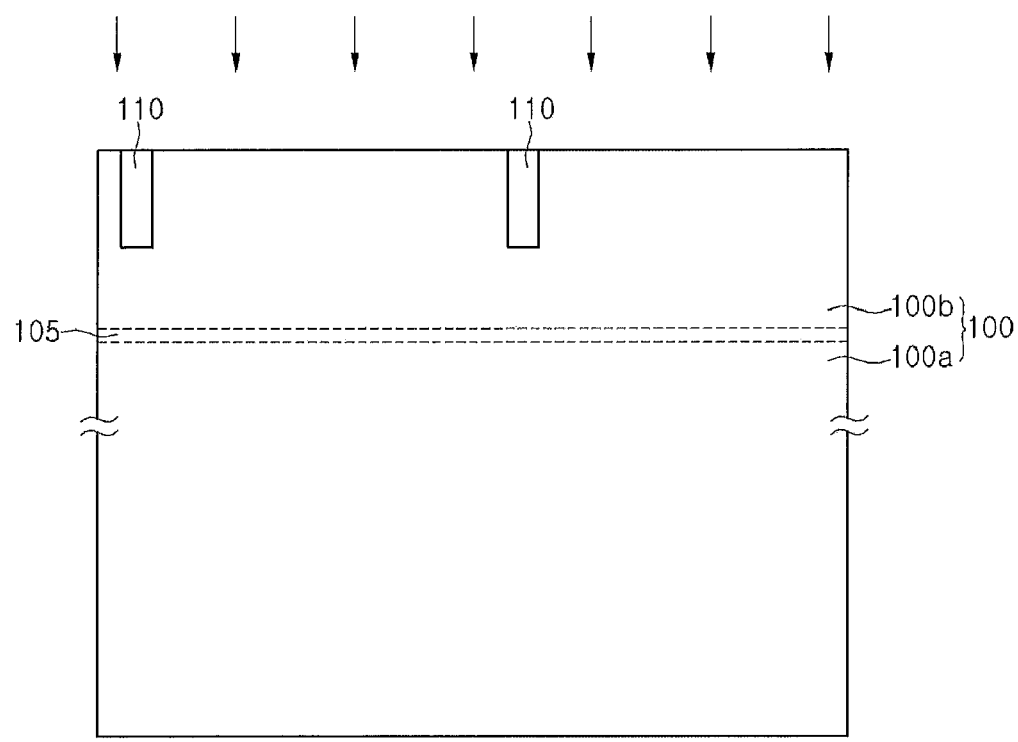
Figure 2C:
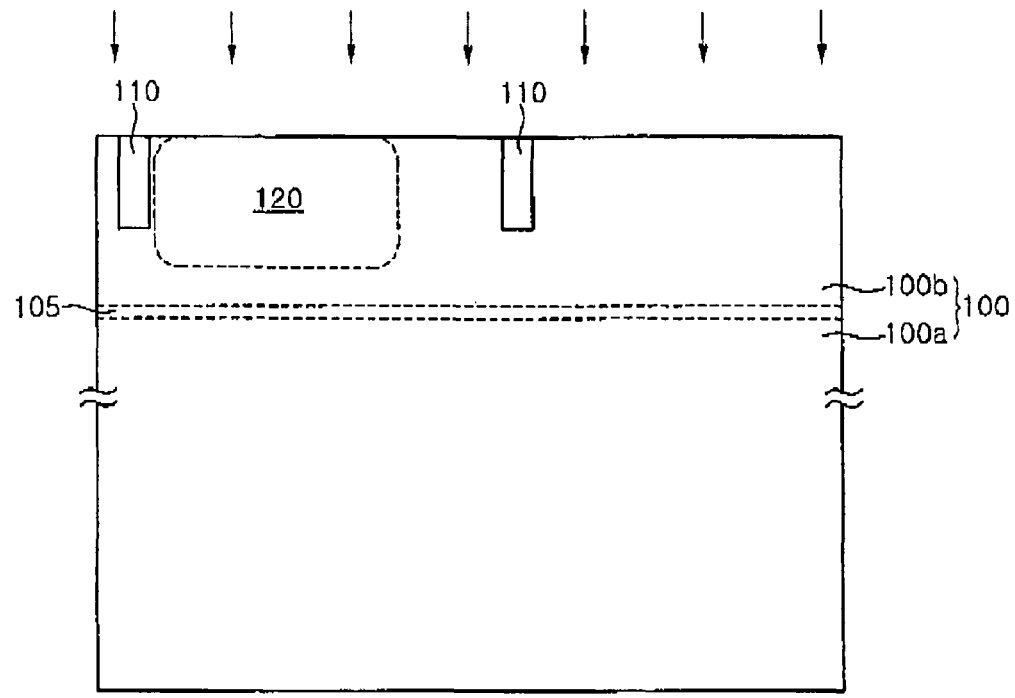

FIGS. 2A to 2C show examples of forming an ion implantation layer 205 in accordance with certain embodiments of the invention.

First, as shown in FIG. 2A, an ion implantation layer 105 is formed in the front side of the first substrate 100. The first substrate 100 may be an epi wafer, but is not limited thereto. The lower part 100a of the first substrate and the upper part 100b of the first substrate is defined by the ion implantation layer 105.

In a method of manufacturing a back side illumination image sensor according to an embodiment, an epi wafer can be used as the donor wafer. Using the epi water can considerably reduce the manufacturing cost as compared with using an SOI wafer.

Further, according to an embodiment, an epi wafer can be used as the donor wafer, and the photosensitive device and the circuit device can be formed together on the epi wafer. Therefore, a bonding process of a 3D-image sensor that forms a photodiode over a circuit is not needed, such that the manufacturing is easy and problems relating to bonding and contacting are removed.

The ion implantation layer 105 may be provided by performing ion implantation to the entire front side of the first substrate 100. It is preferable to perform ion implantation through the front side, because the back side of the first substrate 100 is a few hundred μm.

That is, since the thickness of the first substrate 100 is very large relative to the depth of the ion implantation, it is difficult to perform ion implantation through the back side of the first substrate 100. According to an embodiment, by forming in advance the ion implantation layer 105 before the process of forming the metal line 140 or bonding with the second substrate 200, it is possible to easily remove the lower part 100a of the first substrate after bonding.

The process of forming the ion implantation layer 105 can be performed by implanting ions, such as hydrogen (H) or helium (He), but is not limited thereto.

In another embodiment as shown in FIG. 2B, it is possible to form the ion implantation layer 105 after forming a device isolation region 110 on the front side of the first substrate 100. For example, a pixel region is defined by forming the device isolation region 110 on the front side of the first substrate 100. Thereafter, the ion implantation layer 105 can be formed. The device isolation region 110 can be formed by shallow trench isolation (STI).

According to an embodiment, it is possible to significantly increase the manufacturing yield of the back side illumination image sensor by easily and stably removing the back side of the substrate using the ion implantation layer 105 formed in advance, and not removing the back side of the substrate by grinding.

Further, according to an embodiment, an ion implantation process of hydrogen or helium is performed to form the ion implantation layer 105, which is a cleaving layer, during the processes on the epi wafer. Then the first substrate 100 that is a donor wafer is bonded to the second substrate 200 that is a handle wafer after a process for the first substrate 100 is finished. The cleaving layer can be used to remove the lower part 100a of the first substrate 100.

Since the first substrate 100 that is a donor wafer with the lower part removed is thin after bonding, the second substrate 200 functions as a handle wafer to smoothly progress subsequent processes such as a color filter process, etc.

That is, according to an embodiment, grinding and etchback are not needed by using the ion implantation and cleaving. Accordingly, there is an advantage of not generating problems of the related art, such as an edge die fail and plasma damage.

Further, according to an embodiment, since grinding is not applied to the donor wafer, physical stress is not applied to the donor wafer, such that it is possible to inhibit damage to the photosensitive device and the readout circuit.

According to yet another embodiment, as shown in FIG. 2C, it is possible to form the ion implantation layer 105 after forming the photosensitive device in the pixel region. The photosensitive device 120 may be a photodiode, but is not limited thereto. The photosensitive device 120 can be achieved by forming an N-type ion implantation region 120 on a P-type first substrate 100 and forming a Po region (not shown) on the N-type ion implantation region 120 of the first substrate 100, but it is not limited thereto. Extra electrons can be inhibited by the Po region. Further, according to an embodiment, it is possible to achieve charge dumping effect by forming the PNP junction for the photosensitive device 120.

Figure 3:
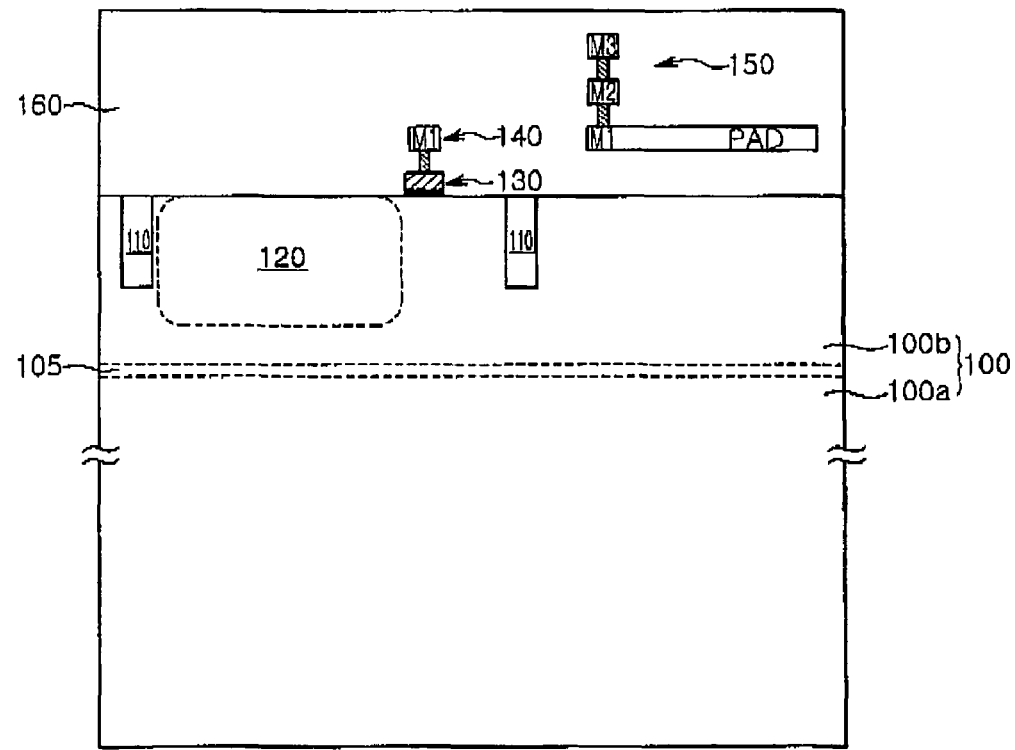

Referring to FIG. 3, after forming the ion implantation layer 105 and the photosensitive device 120, a readout circuit 130, which is a circuit device, is formed on the first substrate 100 formed with the photosensitive device 120. The readout circuit 130 may include a transfer transistor, a reset transistor, a drive transistor, and a select transistor, but is not limited thereto.

According to an embodiment, an epi wafer can be used as the first substrate 100, which is a donor wafer, and the photosensitive device 120 and the readout circuit 130 can be formed together on the first substrate 100. Therefore, a bonding process used in a 3D-image sensor that forms a photosensitive device over a circuit is not needed, such that the manufacturing is easy and problems relating to bonding and contacting are removed. Meanwhile, the handle wafer and the donor wafer can be bonded with a dielectric layer, such as an interlayer dielectric layer, therebetween, resulting in fewer issues in bonding.

Further, according to an embodiment, it is possible to maximize the amount of incident light by minimizing the stack on the illumination part, and interference and reflection of light due to metal routing are removed. Accordingly, it is possible to optimize the optical characteristics of the image sensor.

Subsequently, an interlayer dielectric layer 160 and a metal line 140 are formed on the first substrate 100. The metal line 140 may include a first metal M1, a second metal M2, etc.

In addition, according to an embodiment, a pad metal line 150 can be formed on a logic region. The pad metal line 150 may include a first metal M1, a second metal M2, and a third metal M3 etc., but is not limited thereto. In this configuration, the pad can be formed at the same level as the first metal M1 of the metal line 140. Accordingly, a pad-open process can be easily applied to the back side of the first substrate 100 after the first substrate 100 is bonded with the second substrate 200. This is because the depth from the back side of the first substrate to the pad is shallow.

Figure 4:
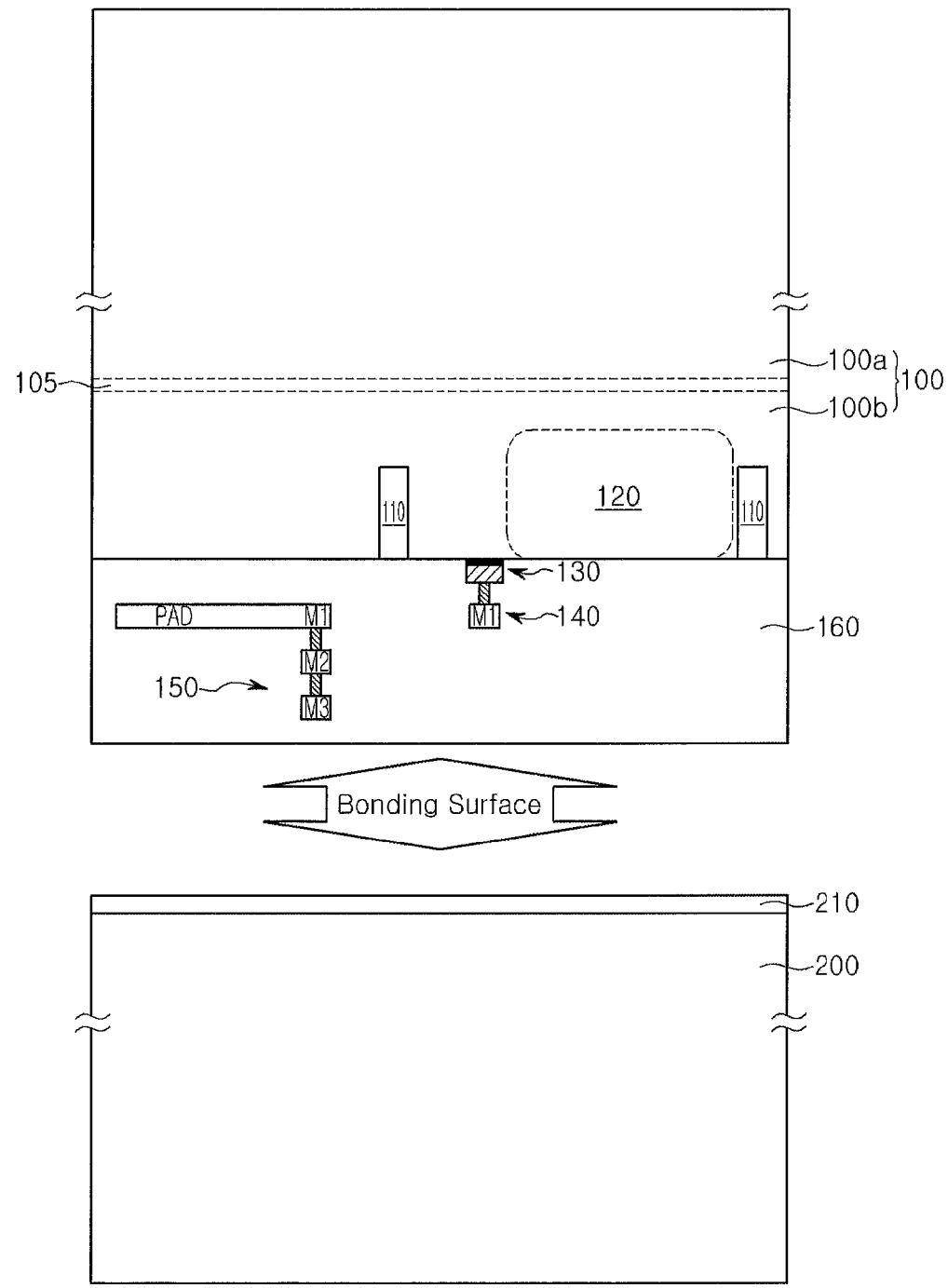

Next, as shown in FIG. 4, a second substrate 200 can be bonded with the front side of the first substrate 100 formed with the metal line 140. For example, the second substrate 200 that is a handle wafer can be bonded to correspond to the metal line 140 of the first substrate 100.

According to an embodiment, it is possible to increase the bonding force with the first substrate by forming a dielectric layer on the upper surface of the second substrate 200 that is bonded with the first substrate 100. The dielectric layer 210 may be an oxide layer or a nitride layer, but is not limited thereto. Bonding is performed with the dielectric layer 210 contacting with the interlayer dielectric layer 160, which is on the front side of the first substrate 100, such that the bonding force between the first substrate 100 and the second substrate 200 can be considerably increased.

Figure 5:
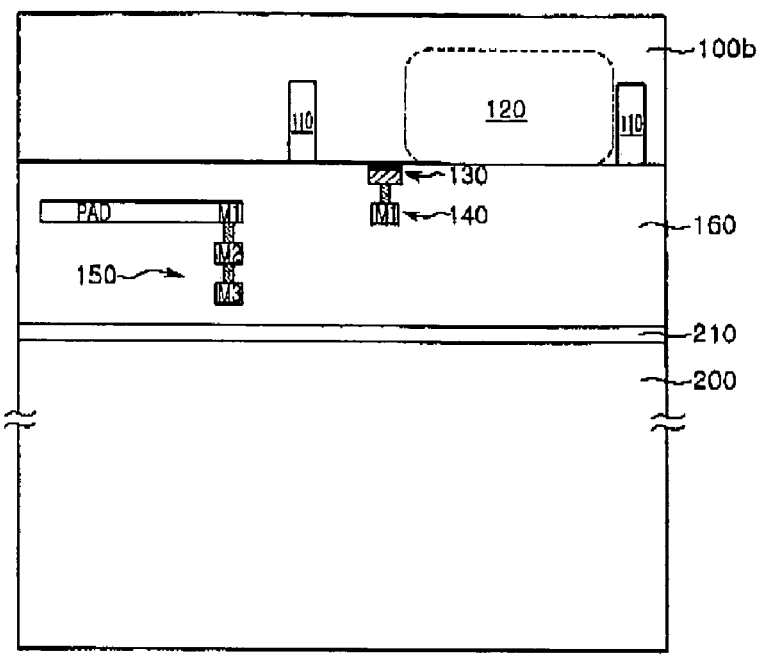

Next, in the first substrate 100 bonded as shown in FIG. 4, the lower part 100a of the first substrate under the ion implantation layer 105 is removed as shown in FIG. 5. For example, the upper part 100b of the first substrate can remain by bubbling the hydrogen ions by applying a heat treatment to the ion implantation layer 105, and cutting and removing the lower part 100a of the first substrate with a blade. Thereafter, planarization can be applied to the cut surface of the first substrate 100.

Meanwhile, in patents relating to a 3D-image sensor using a cleaving technology of the related art, in general, a photosensitive device and a readout circuit are formed at individual wafers, and then bonding and interconnection are performed. In the related art, an ion implantation of hydrogen or helium for forming a cleaving layer is typically performed right before bonding.

However, according to the related art 3D-image sensor, it is difficult to completely electrically connect the readout circuit and the photodiode, and there is a problem that a short is generated in a metal line that is electrically connected with the photodiode.

In contrast, according to an embodiment, an epi wafer can be used as the first substrate 100, which is a donor wafer, and the photosensitive device 120 and the readout circuit 130 can be formed together on the first substrate 100. Therefore, a bonding process between the substrate with a photosensitive device and the substrate with a circuit as in a 3D-image sensor which forms a photosensitive device over a circuit is not needed, resulting in a simple manufacturing process and avoidance of problems relating to bonding and contacting.

Meanwhile, according to the 3D-image sensor of the related art, hydrogen ions may be implanted just before the bonding process. That is, electrons generated from the photosensitive device are transmitted to an electronic circuit device formed on a separate wafer and converted into voltage. Thus, according to the related art, there is no need to form a metal line and an interlayer dielectric layer on the wafer having the photosensitive device, enabling the ion implantation of hydrogen or helium right before bonding in the related art of the 3D-image sensor.

In contrast, according to an embodiment, the photosensitive device 120 and the readout circuit 130 are formed on the same wafer, that is, the first substrate 100. Therefore, according to an embodiment, since the photosensitive device 120 and the readout circuit 130 are on the same first substrate 100, post-processes, such as forming the metal line 140 and the interlayer dielectric layer 160, are performed on the first substrate 100.

Accordingly, when the process scheme of embodiments is used, the ion implantation using hydrogen or helium right is not performed immediately before bonding.

Instead, the ion implantation layer 105 is formed by performing ion implantation of hydrogen or helium before forming the metal line 140 and the interlayer dielectric layer 160 over the epi wafer of the first substrate 100 (donor wafer).

Figure 6:
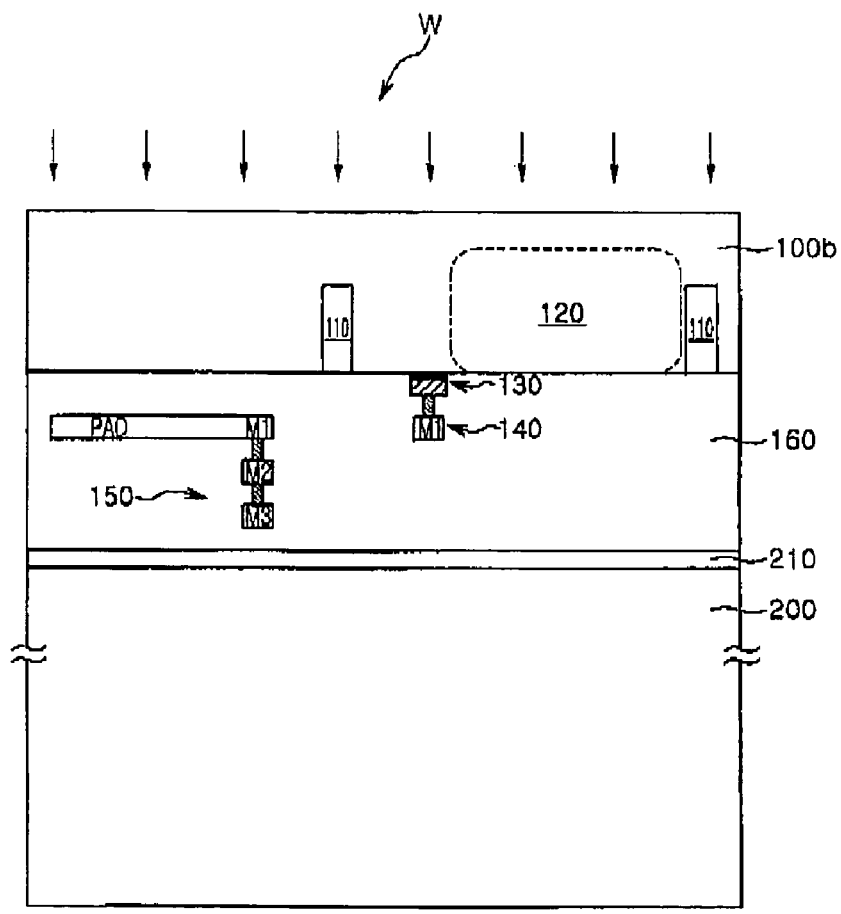

Next, as shown in FIG. 6, wet etching (W) can be applied to the back side of the first substrate. According to embodiments of the invention, it is possible to effectively remove defects on the surface of the substrate that are generated in manufacturing the image sensor and improve image quality without creating the damage due to plasma, by performing wet etching after removing the back side of the substrate.

For example, it is possible to remove defects on the back side of the first substrate by performing wet etching using TMAH (Tetra Methyl Ammonium Hydroxide) liquid, but embodiments are not limited thereto.

Figure 7:
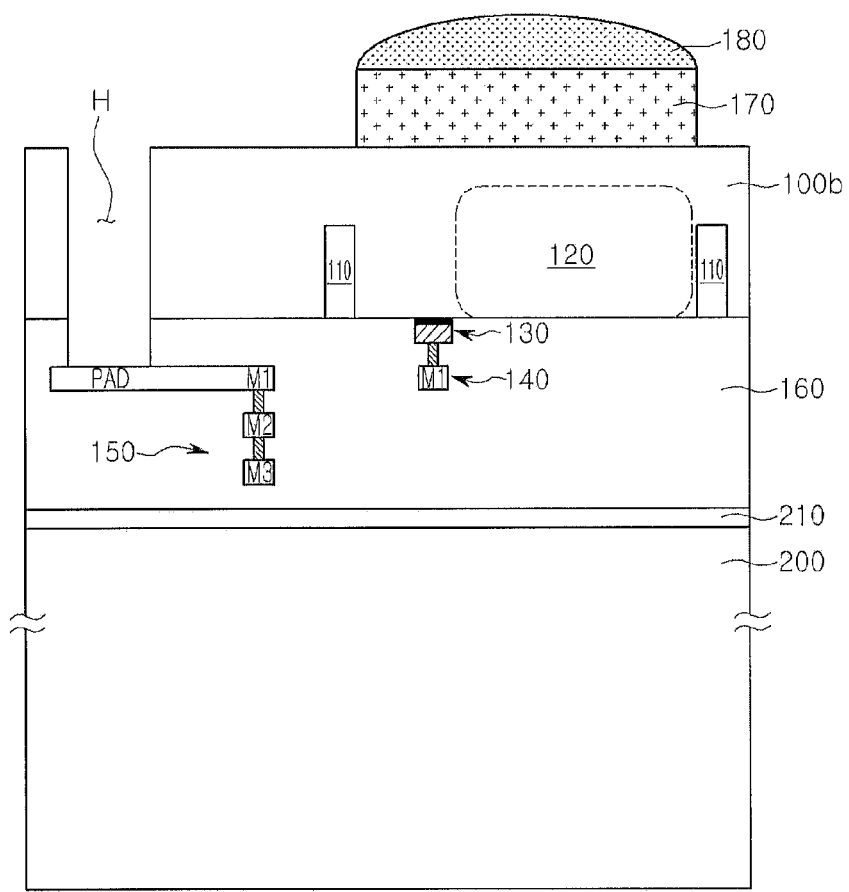

Next, as shown in FIG. 7, a color filter 170 can be formed over the photosensitive device 120 on the back side of the first substrate 100. Meanwhile, for certain embodiments such as where the photosensitive device 120 is an R-G-B-vertical-stacked type photodiode, the color filter may be omitted.

In addition, a microlens 180 can be formed on the color filter 170.

Further, a process of opening the pad can be performed. In one embodiment, the process of opening the pad can be performed subsequent to forming the microlens 180. According to embodiments, it is possible to apply a process of opening the pad to the back side of the first substrate 100. According to an embodiment, since the pad is formed at the level of the first metal M1, it is possible to easily open the pad from the back side of the first substrate 100.

According to the method of manufacturing a back side illumination image sensor of an embodiment, it is possible to stably and efficiently remove the back side of the substrate using an ion implantation technology. That is, according to an embodiment, grinding and etch-back are not needed by using the ion implantation and cleaving. Accordingly, there is an advantage of not generating problems of the related art, such as an edge die fail and plasma damage.

Further, according to embodiments, it is possible to effectively remove defects on the surface of the substrate which are generated in manufacturing the image sensor and improve image quality, without damage due to plasma, by performing wet etching after removing the back side of the substrate.

Further, according to an embodiment, since grinding is not applied to the donor wafer, it is possible to inhibit damage to the photosensitive device and the circuit device.

Further, according to an embodiment, the photosensitive device and the circuit device can be formed together on the epi wafer that is used as the donor wafer. Therefore, according to an embodiment, it is possible to considerably reduce the manufacturing cost by using the epi wafer, as compared with using an SOI wafer.

Further, according to an embodiment, an epi wafer can be used as the donor wafer, and the photosensitive device and the circuit device can be formed together on the epi wafer. Therefore, a bonding process of a 3D-image sensor which forms a photodiode over a circuit is not needed, such that the manufacturing is easy and problems relating to bonding and contacting are removed. Meanwhile, the handle wafer and the donor wafer are bonded with a dielectric layer, such as an interlayer dielectric layer, therebetween, resulting in fewer issues in bonding.

Further, according to an embodiment, it is possible to maximize the amount of incident light by minimizing the stack on the illumination part, and remove interference and reflection of light due to metal routing, such that it is possible to optimize the optical characteristics of the image sensor.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of manufacturing a back side illumination image sensor, comprising:
    forming an ion implantation layer by implanting ions into a front side of a first substrate;
    defining a pixel region by forming a device isolation region on the front side of the first substrate;
    forming a photosensitive device and a readout circuit on the pixel region;
    forming an interlayer dielectric layer and a metal line on the front side of the first substrate over the photosensitive device and the readout circuit;
    bonding a second substrate with the front side of the first substrate formed with the metal line;
    removing a lower part of the first substrate under the ion implantation layer;
    applying wet etching to a back side of the first substrate after removing the lower part of the first substrate; and
    forming a microlens on the photosensitive device at the back side of the first substrate.

2. The method of manufacturing the back side illumination image sensor according to claim 1, wherein the applying of wet etching to the back side of the first substrate is performing wet etching using TMAH (Tetra Methyl Ammonium Hydroxide) liquid.

3. The method of manufacturing the back side illumination image sensor according to claim 1, wherein the forming of the ion implantation layer is a hydrogen ion implantation or a helium ion implantation.

4. The method of manufacturing the back side illumination image sensor according to claim 1, wherein the forming of the ion implantation layer forms the ion implantation layer at a uniform depth throughout the front side of the first substrate.

5. The method of manufacturing the back side illumination image sensor according to claim 1, wherein the removing of the lower part of the first substrate is removing a portion of the first substrate at a side opposite to the front side of the first substrate by applying heat treatment to the ion implantation layer.

6. The method of manufacturing the back side illumination image sensor according to claim 1, further comprising forming a color filter on the back side of the first substrate after the removing of the lower part of the first substrate.

7. The method of manufacturing the back side illumination image sensor according to claim 1, further comprising opening a pad formed on the front side of the first substrate after the removing of the lower part of the first substrate under the ion implantation layer.

8. The method of manufacturing the back side illumination image sensor according to claim 7, wherein the opening of the pad is performing a process of opening the pad to the back side of the first substrate.

9. The method of manufacturing the back side illumination image sensor according to claim 1, further comprising forming a dielectric layer on the second substrate before the bonding of the second substrate with the front side of the first substrate, such that the dielectric layer contacts and is bonded with the front side of the first substrate.

10. The method of manufacturing the back side illumination image sensor according to claim 1, wherein defining the pixel region by forming the device isolation region on the front side of the first substrate is performed before the forming of the ion implantation layer.

11. The method of manufacturing the back side illumination image sensor according to claim 1, wherein the ion implantation layer is formed before defining the pixel region by forming the device isolation region on the front side of the substrate.

12. A method of manufacturing the back side illumination image sensor, comprising:
    forming an ion implantation layer by implanting ions into a front side of a first substrate;
    forming a photosensitive device and a readout circuit on the front side of the first substrate;
    forming an interlayer dielectric layer and a metal line on the front side of the first substrate over the photosensitive device and the readout circuit;
    bonding a second substrate with the front side of the first substrate formed with the metal line;
    removing a lower part of the first substrate under the ion implantation layer;
    applying wet etching to the back side of the first substrate after removing the lower part of the first substrate; and
    forming a microlens on the photosensitive device at the back side of the first substrate.

13. The method of manufacturing the back side illumination image sensor according to claim 12, wherein the applying of wet etching to the back side of the first substrate is performing wet etching using TMAH (Tetra Methyl Ammonium Hydroxide) liquid.

14. The method of manufacturing the back side illumination image sensor according to claim 12, wherein the forming of the ion implantation layer is forming an ion implantation layer at a uniform depth throughout the front side of the first substrate.

15. The method of manufacturing the back side illumination image sensor according to claim 12, further comprising opening a pad formed on the front side of the first substrate after the removing of the lower part of the first substrate under the ion implantation layer.

16. The method of manufacturing the back side illumination image sensor according to claim 15, wherein the opening of the pad is performing a process of opening the pad to the back side of the first substrate.

17. The method of manufacturing the back side illumination image sensor according to claim 12, further comprising forming a dielectric layer on the second substrate before the bonding of the second substrate with the front side of the first substrate, such that the dielectric layer contacts and is bonded with the front side of the first substrate.

18. The method of manufacturing the back side illumination image sensor according to claim 12, wherein the forming of the photosensitive device is performed before the forming of the ion implantation layer.

19. The method of manufacturing the back side illumination image sensor according to claim 12, wherein the ion implantation layer is formed before forming the photosensitive device.

* * * * *